(12) United States Patent
Hagg et al.

(10) Patent No.: US 8,362,351 B2
(45) Date of Patent: Jan. 29, 2013

(54) MODULE COMPRISING A THERMOELECTRIC GENERATOR, AS WELL AS POWER SOURCE

(75) Inventors: Franklin Hagg, Alkmaar (NL); Bouke Fokkes Tuinstra, Leiden (NL)

(73) Assignee: Stork Fokker AESP B.V. (NL)

( * ) Notice: Subject to any disclaimer, the term of this patent is extended or adjusted under 35 U.S.C. 154(b) by 527 days.

(21) Appl. No.: 12/299,987

(22) PCT Filed: May 15, 2007

(86) PCT No.: PCT/NL2007/000128
§ 371 (c)(1),
(2), (4) Date: Mar. 16, 2009

(87) PCT Pub. No.: WO2007/133069
PCT Pub. Date: Nov. 22, 2007

(65) Prior Publication Data
US 2010/0116307 A1    May 13, 2010

(30) Foreign Application Priority Data
May 15, 2006    (NL) ...................................... 1031817

(51) Int. Cl.
*H01L 35/00*    (2006.01)

(52) U.S. Cl. .............. 136/205; 60/284; 60/292; 60/298; 60/299; 136/200; 136/204; 422/110

(58) Field of Classification Search .................... 136/205
See application file for complete search history.

(56) References Cited

U.S. PATENT DOCUMENTS

| 3,056,848 A | 10/1962 | Meyers |
| 3,269,874 A | 8/1966 | Moeller |

(Continued)

FOREIGN PATENT DOCUMENTS

| EP | 0435586 A2 | 7/1991 |
| EP | 1571718 A | 9/2005 |

(Continued)

OTHER PUBLICATIONS

Search Report of NL 1031817.

(Continued)

*Primary Examiner* — Jennifer Michener
*Assistant Examiner* — Matthew Martin
(74) *Attorney, Agent, or Firm* — Ryan A. Schneider, Esq.; Troutman Sanders LLP

(57) ABSTRACT

According to a first aspect, the invention relates to a TEG module, in particular for a power source (10), comprising a space (14) at least partially delimited by walls (16), at least one thermoelectric generator (20) for the conversion of heat into electricity, in which at least one electrically insulated wall part is in thermally conducting contact with a first side (52) of the thermo-electric generator (20), and the second side (54) is in heat-exchanging connection with an electrically insulated discharge element (12) for discharging heat used by the thermoelectric generator, as well as electrical conductors connected to the first and second side respectively (52, 54) for the conduction of generated electricity, with thermally conducting pressure means for applying pressure to the said second side being provided between the second side (54) and the discharge element (12), the said means comprises a thermally conducting flexible container (50), which is filled with a pressure medium in a state of over-pressure.

19 Claims, 3 Drawing Sheets

U.S. PATENT DOCUMENTS

| | | | |
|---|---|---|---|
| 3,428,496 A | 2/1969 | Lockwood | |
| 3,607,444 A * | 9/1971 | DeBucs | 136/208 |
| 3,620,205 A * | 11/1971 | Vial | 126/110 E |
| 3,879,229 A * | 4/1975 | Gilbert | 136/208 |
| 3,881,962 A | 5/1975 | Rubinstein | |
| 4,095,998 A | 6/1978 | Hanson | |
| 6,307,142 B1 | 10/2001 | Allen et al. | |
| 6,986,247 B1 * | 1/2006 | Parise | 60/284 |

FOREIGN PATENT DOCUMENTS

| | | |
|---|---|---|
| EP | 1615274 A | 1/2006 |
| WO | WO-03/063256 A2 | 7/2003 |

OTHER PUBLICATIONS

International Search Report of PCT/NL2007/000128.

\* cited by examiner

MODULE COMPRISING A THERMOELECTRIC GENERATOR, AS WELL AS POWER SOURCE

BENEFIT CLAIMS

This application is a US National Stage of International Application No. PCT/NL2007/000128, filed 15 May 2007, which claims the benefit of NL 1031817, filed 15 May 2006.

According to a first aspect, the invention relates to a module comprising a thermoelectric generator (hereafter also abbreviated to "TEG module"). According to a second aspect, the invention relates to a power source, in particular a portable power source, which comprises a thermoelectric generator (hereafter also "TEG").

People who stay at a distance from urban districts, such as military personnel on exercise or during an operation, walkers and outdoor sportsmen and sportswomen, are using ever more electrical and electronic equipment, such as communication and navigation equipment, laptop and palmtop computers, all sorts of photographic and video equipment, stereo equipment and the like. For this mobile equipment, the electrical power supply is mostly provided by rechargeable or other batteries. Rechargeable batteries and disposable batteries often contain environmentally unfriendly substances such as compounds containing Cd, Li, Hg and Ag. These environmentally unfriendly substances constitute a potential danger to the health of humans and animals. Therefore, such batteries are mostly collected and processed separately, which requires an expensive logistical system. Another drawback is the relatively low energy density of such batteries. Because of this low density, in practice, the batteries are relatively heavy, which is disadvantageous for the user for the said mobile applications. Another drawback primarily of rechargeable batteries is that the time required to charge a discharged battery is relatively long.

In WO-A2-2005/069414, a power source, in particular a miniaturized battery, which is suitable for these mobile applications, is disclosed. For generating the electrical power, readily available fuels such as propane and butane can be used. The energy liberated during combustion of these fuels, mostly heat, is converted by the thermoelectric generator into electricity. Compared to the batteries mentioned earlier, for this known power source, substances that are harmful to the environment and health are used to much lesser degree. Because of the high energy density of the said fuels, the weight of the mobile or portable power source can be lower than that of a battery of comparable energy capacity. The fuel can also be refilled simply and quickly, if necessary, without the need to interrupt the supply of power for a long duration.

In a thermoelectric generator, energy, in particular the heat obtained by combustion of a fuel in a combustion chamber, is transferred from the hot side of the TEG by thermally conducting electrons, vacancies, or ions to the cold side, and on recombination of the electrons and vacancies, or of the ions, a positive current is generated at the cold side. One of the factors that determines the efficiency of the power source is the heat transfer and/or heat conduction from the combustion chamber to the hot side of the TEG and from the cold side of the TEG to a discharge system for discharging heat consumed by the TEG. This means that there must be a good thermal contact between the different components, the said components forming the thermal path taken by the thermal current. Solutions to this are described in the state of the art, such as spring systems according to the U.S. Pat. Nos. 3,714,539 and 4,043,835. Further, in the latter specification, an additional thermal path is provided in the form of a flexible sleeve made of a thermally conducting material around the spring in order to connect the cold side of the TEG with a heat discharging element. It is acknowledged in these patent specifications that the heat-exchanging contact of such spring systems is limited.

The object of the invention is to provide a module comprising a thermoelectric generator, in which the thermal contact at the hot side of the TEG as well as at the cold side of the TEG is good, or to provide a suitable alternative.

Further, the object of the invention is to provide a power source, in particular a portable power source for mobile applications, in which the heat-exchanging contact is likewise good.

According to a first aspect, the invention relates to a module comprising a thermoelectric generator, in particular for a power source, comprising a space at least partially delimited by walls, at least one thermoelectric generator for the conversion of heat (such as radiation energy) into electricity, in which at least one electrically insulated wall part of the said space is in thermally conducting contact with a first side (hot side) of the thermoelectric generator, and the second side (cold side) of the thermoelectric generator is in heat-exchanging connection with an electrically insulated discharge element for discharging heat used by the thermoelectric generator, as well as electrical conductors connected to the first and second side respectively of the thermoelectric generator for the conduction of the electricity generated by the thermoelectric generator, with thermally conducting pressure means for applying pressure to the said second side being provided between the second side of the thermoelectric generator and the discharge element, the said means comprising a thermally conducting flexible container, which is filled with a pressure medium in a state of overpressure.

The TEG module according to the invention, which in particular is suitable for manufacturing a power source which will be described hereafter, comprises a space or chamber, which is at least partially delimited by walls. An electrically insulated wall part thereof is in thermally conducting contact with a first side (in operation hot side) of at least one thermoelectric generator. The TEG module advantageously comprises multiple electrical generators, which are distributed over the periphery of the space. The second side of the thermoelectric generator is in heat-exchanging connection with a discharge element via the thermally conducting flexible container for discharging the used heat. The thermally conducting flexible container is filled with a pressure medium in a state of overpressure. The flexible container advantageously bears against the whole second side of the TEG, so that a relatively large thermally conducting surface is provided and the used heat can be quickly discharged from the TEG to the discharge element. The pressure medium, which is in a state of overpressure, at the same time ensures that all components of the TEG module are well pressed against each other, so that also at the periphery of the space, good contact exists between the wall part in question and the hot side of the TEG. Furthermore, the flexible container acts as a means that can compensate the thermal expansion of the different materials of which the other components of the module are constructed.

The pressure medium is advantageously in a state of regulated, preferably constant, pressure. Owing to this, the pressing force on the components of the TEG is constant and independent of the temperature of the hot side of the thermoelectric generator. This is especially important if the hot side of the TEG module is heated discontinuously. When the pressure of the pressure medium is (dynamically) controlled, the pressing force is sufficient, even in the cold state, to press the components against each other. On the other hand, pressure regulation can prevent the pressing force in the hot state from becoming so, large that the thermoelectric elements would fail.

To obtain a sufficiently high pressing force on the components of the TEG, the pressure of the pressure medium is preferably higher than 2 bar.

In this description, the expression "TEG module" refers to a prefabricated unit, which can be supplied separately for the intended application.

When utilizing such a TEG module in a power source, use is made of one or more electrical generators, in which the heat liberated in the flame during combustion of the fuel is converted into electricity.

Another application of the TEG module according to the invention relates to its use in an exhaust system, for example of a motor vehicle such as a car, in which the exhaust gases supply the heat, which is converted into electricity by the TEG(s). The space is then the exhaust pipe.

A thermoelectric generator that can be operated at high temperature (higher than approximately 400° C.) is advantageously a used. In a TEG, energy, in this case heat obtained by combustion of a fuel in the combustion chamber, is transferred from the hot side of the TEG to the cold side and by this means partially converted into electricity. The cold side of the TEG is, according to the invention, delimited by a flexible container. The flexible container advantageously comprises a closed volume delimited by a thermally conducting foil, preferably metal foil such as copper or the like. The pressure of the pressure medium in the flexible container ensures that very good heat conduction is obtained, the TEGs being mechanically loaded uniformly at the same time.

The flexible container can further contain a thin electrically insulating but thermally conducting film on the outside, just as the electrical contact required for the cold side of the TEG. Such a container can be simply and accurately prefabricated, whereas the final assembly in the TEG module can take place more efficiently.

The pressure medium is preferably a thermally conducting fluid, which is chosen from a thermally conducting liquid or vapour, a mixture of liquid and vapour, or a thermally conducting paste.

In an advantageous embodiment of the TEG module according to the invention, the module is further provided with control means for regulating the pressure of the pressure medium in a state of over-pressure in the flexible container, so that, depending on the application circumstances, the good thermal contact and the mechanical load can be regulated. Preferably, the control means are equipped for dynamic control of the pressure of the pressure medium in a state of overpressure. For static control, the pressure is maintained at a predetermined value.

Examples of such control means contain a mechanical spring system, which keeps the flexible container at a constant pressure as a result of the fixed spring pressure, a spring system such as a spiral or cupped spring washer coupled to a clamping arm of which the clamping force is adjustable, for example, with an adjusting screw, a flexible container that is connected via an opening to an optionally adjustable piston cylinder system, and so on.

According to a second aspect, the invention relates to a power source, in particular a portable power source, comprising a combustion chamber at least partially delimited by walls, a thermoelectric generator for the conversion of energy liberated by combustion into electricity, a burner mounted in the chamber provided with a fuel supply, an air supply for supplying combustion air, as well as an air outlet for discharging combustion gases out of the combustion chamber, in which at least one electrically insulated wall part of the combustion chamber is in thermally conducting contact with a first side of the thermoelectric generator, and a second side of the thermoelectric generator is in heat-exchanging connection with an electrically insulated discharge element for discharging heat consumed by the thermoelectric generator, electrical conductors connected to the first and second side respectively of the thermoelectric generator for the conduction of electricity generated by the thermoelectric generator, with thermally conducting means for applying pressure to the said second side of the thermoelectric generator being provided between the second side of the thermoelectric generator and the discharge element, the said means comprising a flexible container, which is filled with a pressure medium in a state of overpressure.

The walls, which are in direct or indirect contact with a thermoelectric generator, preferably have a substantially cylindrical shape.

The power source according to the invention is characterized by the same advantages as described above for the TEG module according to the invention. Preferred embodiments of the TEG module are applicable in an identical way to the power source according to the invention.

Besides a high-temperature TEG, a low-temperature TEG (hot side approximately 200° C.) can be advantageously applied. The low-temperature TEG can be connected thermally in series with the high-temperature TEG, the hot side of the low-temperature TEG being thermally coupled to the cold side of the high-temperature TEG.

The discharge element for discharging heat consumed by the thermoelectric generator can, for example, contain a metal plate provided with fins. Another embodiment of the discharge element is a cooler for forced cooling, such as a fan. The function of the discharge element is to discharge the heat to the cold side of the TEG and transfer it to the surrounding air. The flow resistance of the discharge element is advantageously low, so that the load of the means that are used for supplying cooling air is low, certainly in the case of a fan. As described earlier, the temperature of the cold side of the TEG is kept as low as possible to be able to generate sufficient electrical power at high efficiency in the TEG. A uniform temperature over the surface of the cold side of the TEG is preferred.

In yet another embodiment of the power source according to the invention, the latter is provided with a heat recovery section for recovering heat from the, during operation, hot combustion gases. In this embodiment, the heat from the hot combustion gases of the burner is used to preheat the entering combustion air. It is preferred that the thermal transfer between the hot and cold gases is high, conduction in the direction of flow of the combustion gases and combustion air respectively being suppressed as much as possible. The pressure loss in the heat recovery section is advantageously low, so that the parasitic electrical power needed to compress the combustion air is minimal. The power source according to the invention contains a burner.

The burner consists of three components, namely a vaporizer, a mixer and an igniter. Usually, the dimensions of the burner are of the order of magnitude of several millimetres to several centimetres. Fuel is fed to the burner, in particular to the mixing section, via the fuel supply. In the mixer, in the recovery section, preheated combustion air is advantageously mixed with the fuel in such a way that a good combustion is obtained. The pressure loss is kept low in the mixer. In the vaporizer, fuel is converted into vapour, if necessary using a liquid fuel. In a favourable embodiment, the heat needed for vaporization is extracted from the hot combustion gases by means of heat conduction. For the sake of clarity in the context of this description, combustion air means the air needed for combustion, whereas the term "combustion gases" means the gaseous products remaining after combustion. In a preferred embodiment, the vaporizer consists of a vaporization chamber, which is partially filled with an open thermally conducting porous material, in particular a metal foam. Fed (liquid) fuel is drawn by capillary action into the porous material and vaporizes in the pores so that the formation of vapour bubbles having a diameter larger than the pores of the porous material is prevented. The function of the igniter is to vaporize and ignite an amount of fuel. The vaporization of fuel that is needed for the first ignition can occur advantageously with the aid of an electrical heater. In order to limit the power needed for ignition, the amount of fuel that is ignited is kept small. As a result of this, a first, small flame is produced, which heats the burner as well as the space in the combustion chamber. When a sufficiently high temperature is reached, heat is transported by conduction to the vaporizer, so that further vaporization of fuel can occur and the normal burner can come into operation. It should be noted that the term "burner" does not mean that the combustion that occurs must involve a flame. The combustion can also occur on gauze or sponge material, for example with a ceramic or metal foam structure. To supplement the convective transport, a radiation-emitting body can be placed between the burner and the thermoelectric generator to increase the transfer of radiant heat between flame and TEG.

In the invention, use is preferably made of a separate inlet for the combustion air and separate inlet for the fuel. This makes it possible to preheat the combustion air in the heat recovery section to a high temperature without fouling occurring as a result of premature combustion.

The invention is explained hereafter with reference to the appended drawing, in which.

It should be noted that for clarity, the illustrations are not drawn to scale, but certain details are reproduced larger than in reality.

Figure 1:
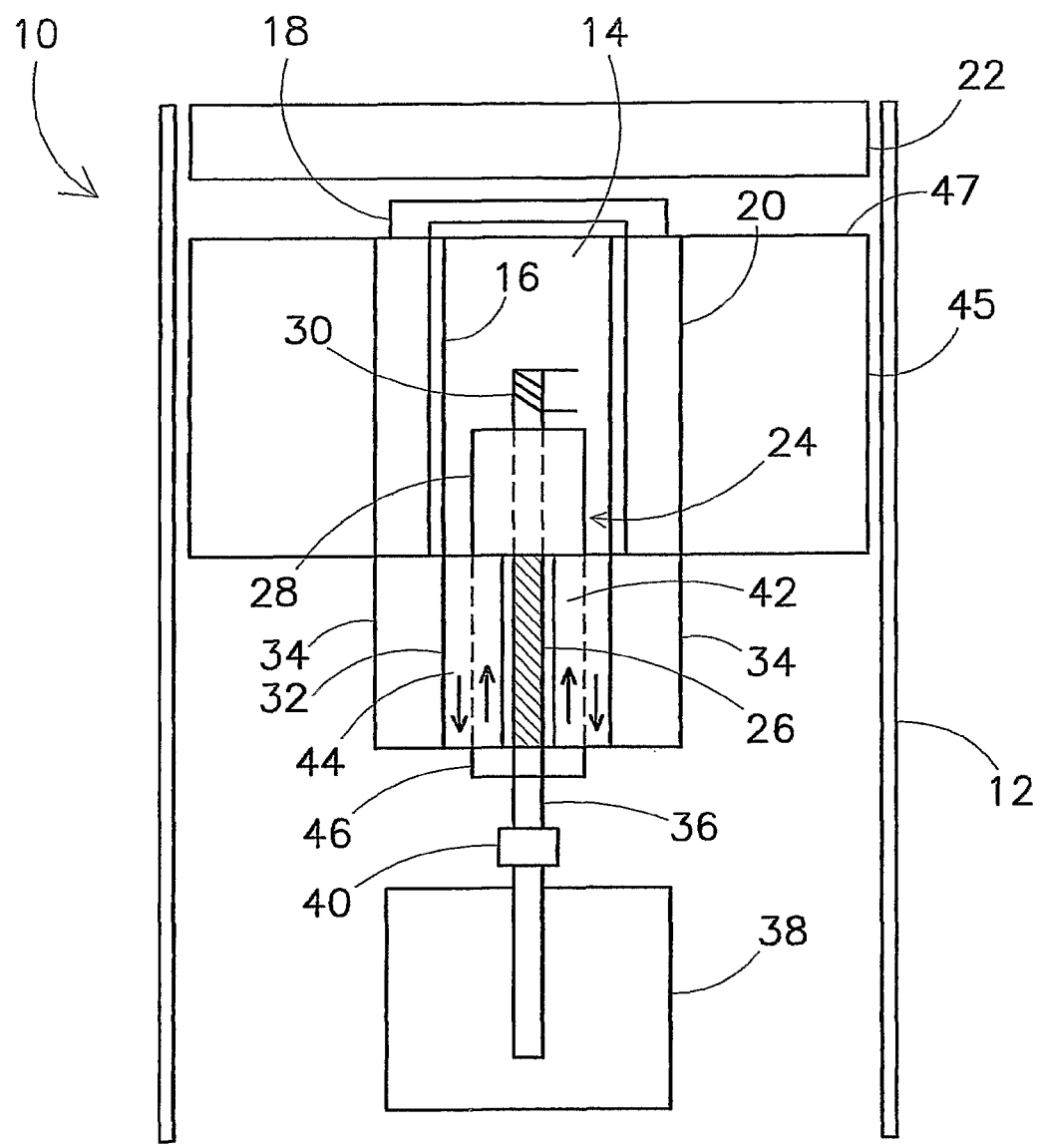
FIG. 1 shows schematically an embodiment of a power source according to the invention.

FIG. 1 shows schematically an embodiment of a power source according to the invention. The power source—in its entirety indicated by reference numeral 10—comprises a case 12, that is here only partially reproduced. In the case 12 is a combustion chamber 14, which in the embodiment shown is cylindrical. The combustion chamber 14 is delimited by an upright cylindrical wall 16 of a thermally conducting material, which can be constructed of multiple sections. The upper end of the combustion chamber 14 is provided with a layer of thermally insulating material 18. The upright wall 16 of the combustion chamber 14 is in thermally conducting contact with a large number of TEG elements 20, which are distributed over the outer periphery of this wall 16. The lower end of the combustion chamber 14 is delimited by a recovery section 32 and a burner 24. The burner 24 consists of a vaporizer 26, a mixer 28 and an igniter 30. In the embodiment shown in FIG. 1, the vaporizer 26 is under the combustion chamber 14 and is surrounded by the cylindrical recovery section 32. In order to limit heat losses in the recovery section 32, the outer side thereof is provided with a layer of insulating material 34. The burner 24 is connected via a fuel pipe 36 to a fuel tank 38.

A fuel pump 40 is provided in the fuel pipe 36. The recovery section 32 consists of annular concentric channels 42, 44, in which, in the embodiment shown, the entering combustion air, which is drawn by a fan 46, is heated by the discharged combustion gases in the outer annular channel 44 of the recovery section 32. A cooling fan is indicated by reference numeral 22. The space between wall 16 and discharge wall 45 is hermetically sealed by module case 47 and filled with an inert gas such as argon or xenon to protect the TEG elements 20 and contacts from oxidation, for which xenon has the advantage that it has a low conductance of heat. To obtain the highest possible electrical voltage, the TEG elements 20 are all, or in groups, connected in series. In the module case 47, one or more lead-throughs 49 (see FIG. 2) are fitted to bring the electrical connection of the TEG elements to the outside.

Figure 2:
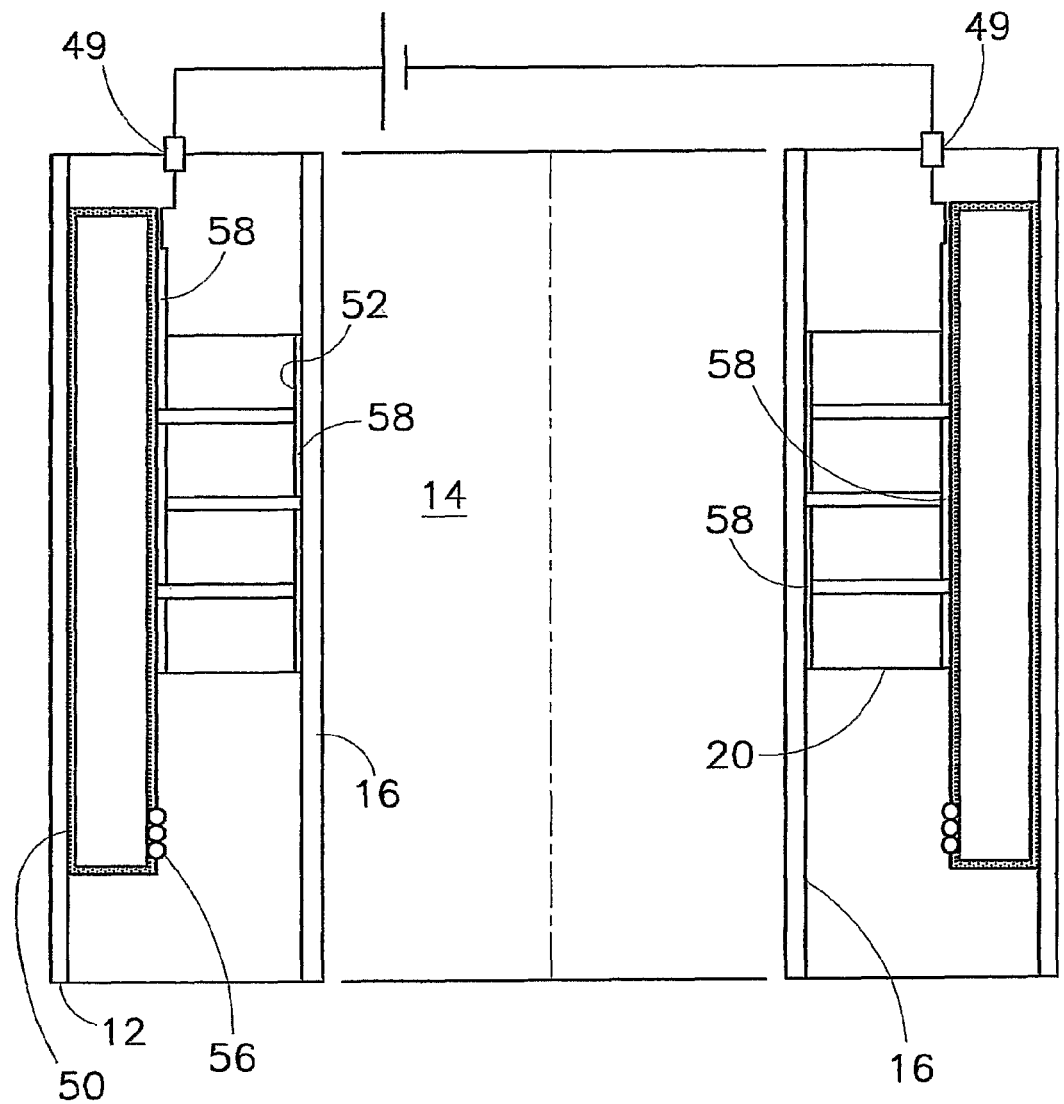
FIG. 2 shows a longitudinal section of an embodiment bf a TEG module according to the invention.
Figure 3:
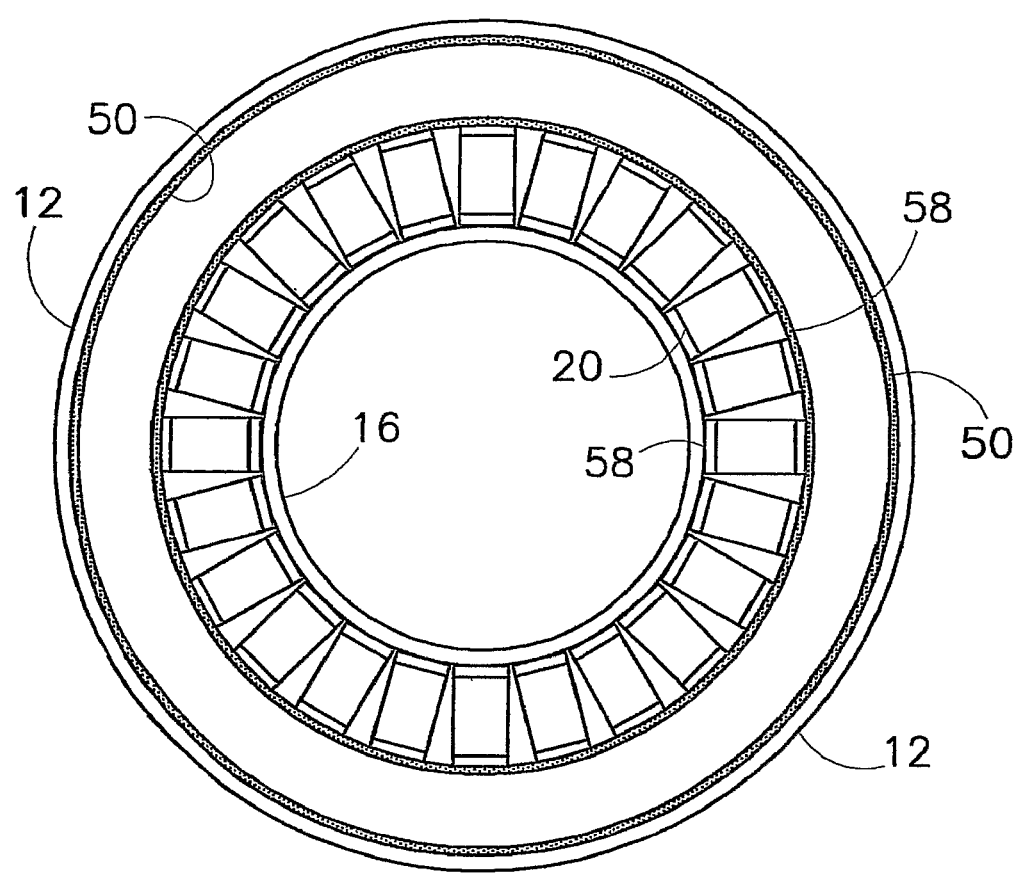
FIG. 3 is a cross section of the TEG module according to FIG. 2.

In the embodiment shown, the TEG module is formed by the combustion chamber 14, at least the space delimited by the upright wall 16, the thermoelectric generator(s) 20 and a flexible container 50, which in particular is drawn in FIGS. 2 and 3, as well as the discharge element, which in this case is formed by the cylindrical case 12.

Operation is as follows. With the aid of the fuel pump 40, fuel is transported through the fuel pipe 36 from the fuel tank 38 to the vaporizer 26 and vaporizes. The vapour formed in this way flows to the mixer 28, where the vapour is mixed with preheated combustion air supplied through channel 42. This combustion air is drawn by the fan 46 and preheated in the recovery section 32 by means of heat exchange with the hot combustion gases, which are discharged via channel 44. In the combustion chamber 14 is also an igniter, which is used during the start-up phase to ignite the burner. Under normal circumstances, the mixture of preheated air and vaporized fuel is burned in the combustion space of the combustion chamber. Part of the energy liberated during combustion of the fuel with the preheated combustion air is delivered via the thermally conducting wall 16 to the hot side 52 of a TEG element 20. This heat is delivered at the cold side 54 of the TEG to the flexible container and then to the discharge element. If desired, the discharge element can be force-cooled, for example with the aid of drawn-in surrounding air. The thermal current in the TEG 20 generates an electrical potential, which can be used to supply electrical power.

A schematic reproduction of an embodiment of a TEG module according to the invention is shown in FIGS. 2 and 3. A large number of TEG elements 20 is by this means provided between a cylindrical burner tube, which forms a thermally conducting wall 16 and is made of, for example, silicon carbide or stainless steel, and the inner side of the discharge element, again the case 12. To ensure good thermal contact between, on the one side, the burner tube 16 and the TEG elements 20, and between the TEG elements 20 and the discharge element 12, a flexible container 50, for example of copper foil, which is filled with a thermal paste, for example silicone grease containing dispersed silver particles or a mixture of metals that are liquid at room temperature such as indium, is placed between the cold side 54 of the TEG elements 20 and the discharge element 12. The side of the foil that adjoins the TEG elements 20 is provided with an electrically insulating material. A similar electrically insulating but thermally conducting material is provided betweeen the wall 16 or burner tube and the hot side 52 of the TEG elements 20. The pressure medium in the flexible container 50 is brought under pressure beforehand and thus the flexible container exerts a uniform pressing force on all TEG elements. As indicated schematically in FIG. 2, a spring construction can be provided as control means 56 to keep the overpressure in the flexible container 50 constant, which at the same time, is able to compensate for thermal expansion of components of the TEG module, such as, for example, the burner tube and the TEG elements. Electrical conductors 58, which can be of layered construction, are provided both on the hot side on and the cold side 52, respectively 54, of the TEG 20.

Figure 4:
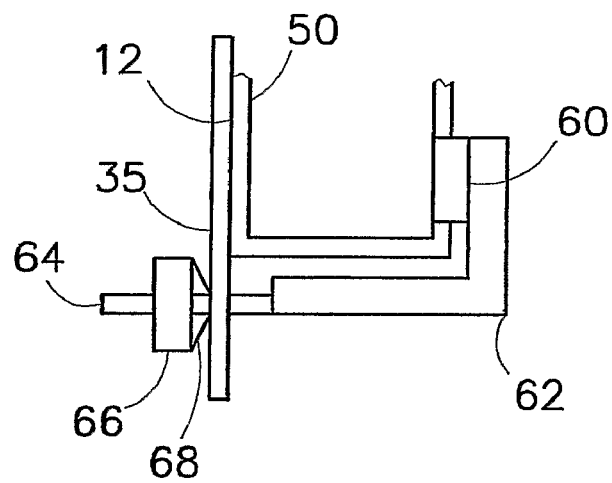
FIG. 4 shows an embodiment of a detail of a TEG module or power source according to the invention.

FIG. 4 shows another embodiment of control means 56 for regulating the pressure of the pressure medium in a state of overpressure in the flexible container 50. In FIG. 4, the flexible container 50 is clamped between a pressure-distributing body 60 attached to a clamping arm 62 and the outer wall or case 12 which functions as discharge element. At one end, the clamping arm 62 is provided with a threaded rod 64, which extends through the outer wall 12. An adjusting nut 66, in combination with a spiral spring or cupped spring washer 68 pulls the threaded rod 64 outwards. In this way, the pressure in the flexible container 50 can be adjusted from the outer side of the TEG module by turning the adjusting nut 66.

Alternative control means comprise for example a spiral spring, which is inserted, in compressed state, in the space between the flexible container and the burner tube, and after expansion is mounted. A clamping ring is another usable alternative. Yet other alternatives comprise a spiral spring, which is fitted between an inner ring and a pressure distributor, or a spring-energized piston, which is connected by fluid to the flexible container.

The invention claimed is:

1. TEG A thermoelectric generator module comprising a space at least partially delimited by walls, at least one thermoelectric generator comprising a plurality of thermoelectric elements and electrical conductors connected to first and second sides, respectively, of the thermoelectric generator for the conduction of electricity generated by the thermoelectric generator for the conversion of heat into electricity, wherein at least one electrically insulated wall part of the space is in thermally conducting contact with the first side of the thermoelectric generator, and wherein the second side of the thermoelectric generator is in heat-exchanging connection with an electrically insulated discharge element for discharging heat used by the thermoelectric generator, with thermally conducting pressure means for applying pressure to the second side, which thermally conducting pressure means is provided between the second side of the thermoelectric generator and the discharge element and contacting the thermoelectric generator, the thermally conducting pressure means comprising a thermally conducting flexible container, which is filled with a pressure medium in a state of overpressure, wherein the thermally conducting flexible container exerts a uniform force against all of the thermoelectric generator.

2. Module according to claim 1, wherein the flexible container is made of metal foil.

3. Module according to claim 1, wherein the pressure medium is a thermally conducting fluid.

4. Module according to claim 1, further comprising control means on or in the thermally conducting flexible container for regulating the pressure of the pressure medium in a state of overpressure in the flexible container.

5. Module according to claim 4, wherein the control means are equipped for dynamic control of the pressure of the pressure medium in a state of overpressure.

6. Module according to claim 4, wherein the control means are equipped to keep the pressure medium under a constant pressure.

7. Module according to claim 1, wherein the pressure of the pressure medium is greater than 2 bar.

8. Power source comprising a combustion chamber at least partially delimited by walls, a thermoelectric generator comprising a plurality of thermoelectric elements and electrical conductors connected to first and second sides, respectively, of the thermoelectric generator for the conductions of electricity generated by the thermoelectric generator for the conversion of energy liberated by combustion into electricity, a burner mounted in the chamber provided with a fuel supply, an air supply for supplying combustion air, as well as an air outlet for discharging combustion gases out of the combustion chamber, wherein at least one electrically insulated wall part of the combustion chamber is in thermally conducting contact with the first side of the thermoelectric generator, and wherein the second side of the thermoelectric generator is in heat-exchanging connection with an electrically insulated discharge element for discharging heat consumed by the thermoelectric generator, with thermally conducting means for applying pressure to the second side of the thermoelectric generator, which thermally conducting pressure means is provided between the second side of the thermoelectric generator and the discharge element and contacting the thermoelectric generator, the thermally conducting pressure means comprising a thermally conducting flexible container, which is filled with a pressure medium in a state of overpressure, wherein the thermally conducting flexible container exerts a uniform force against all of the thermoelectric generator.

9. Power source according to claim 8, wherein the container is made of metal foil.

10. Power source according to claim 8, wherein the pressure medium is a thermally conducting fluid.

11. Power source according to claim 8, further comprising control means on or in the thermally conducting flexible container for regulating the pressure of the pressure medium in a state of overpressure in the flexible container.

12. Power source according to claim 11, wherein the control means are equipped for dynamic control of the pressure of the pressure medium in a state of overpressure.

13. Power source according to claim 11, wherein the control means are equipped to keep the pressure medium under a constant pressure.

14. Power source according to claim 8, wherein the pressure of the pressure medium is greater than 2 bar.

15. Power source according to claim 8, wherein the discharge element comprises a cooler for forced cooling.

16. Power source according to claim 8, further comprising a heat recovery section for recovering heat from the combustion gases.

17. An exhaust system of a motor vehicle comprising a thermoelectric generator module according to claim 1.

18. Module according to claim 1, wherein the module is for a power source.

19. Power source according to claim 8, wherein the power source is portable.

* * * * *